(12) United States Patent
Lu

(10) Patent No.: US 12,165,582 B2
(45) Date of Patent: Dec. 10, 2024

(54) DISPLAY PANEL FOR REDUCING FLICKERING DISPLAY

(71) Applicant: Wuhan China Star Optoelectronics Semiconductor Display Technology Co., Ltd., Hubei (CN)

(72) Inventor: Kai Lu, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/781,008

(22) PCT Filed: May 13, 2022

(86) PCT No.: PCT/CN2022/092727
§ 371 (c)(1),
(2) Date: May 30, 2022

(87) PCT Pub. No.: WO2023/216239
PCT Pub. Date: Nov. 16, 2023

(65) Prior Publication Data
US 2024/0161692 A1    May 16, 2024

(30) Foreign Application Priority Data
May 7, 2022   (CN) .......................... 202210494260.3

(51) Int. Cl.
*G09G 3/3233* (2016.01)
*H10K 59/121* (2023.01)

(52) U.S. Cl.
CPC ....... *G09G 3/3233* (2013.01); *H10K 59/1213* (2023.02); *G09G 2300/0819* (2013.01);
(Continued)

(58) Field of Classification Search
CPC .................................................. G09G 3/3233
See application file for complete search history.

(56) References Cited

U.S. PATENT DOCUMENTS

| 8,830,219 B2 * | 9/2014 | Choi ................... | G09G 3/3233 345/76 |
| 8,994,619 B2 * | 3/2015 | Jeong .................. | G09G 3/3233 345/82 |

(Continued)

FOREIGN PATENT DOCUMENTS

| CN | 106558287 | 4/2017 |
| CN | 106710529 | 5/2017 |

(Continued)

OTHER PUBLICATIONS

International Search Report and the Written Opinion Dated Dec. 13, 2022 From the International Searching Authority Re. Application No. PCT/CN2022/092797 and It's Translation Into English. (18 Pages).

(Continued)

*Primary Examiner* — Chun-Nan Lin

(57) ABSTRACT

A display panel is provided. In the display panel, a width-to-length ratio of a sub-channel of a compensation transistor adjacent to a drive transistor is less than a width-to-length ratio of a channel of a first initialization transistor, so that an effect of an increase in an electrical potential of a gate of the drive transistor affected by an electrical leakage of the compensation transistor is canceled by an effect of a decrease in the electrical potential of the gate of the drive transistor affected by an electrical leakage of the first initialization transistor, so as to prevent an electrical leakage of each transistor from causing changes in the electrical potential of the gate of the drive transistor, thereby reducing a problem of the flickering display.

20 Claims, 9 Drawing Sheets

(52) U.S. Cl.
CPC .............. *G09G 2300/0842* (2013.01); *G09G 2300/0861* (2013.01); *G09G 2320/0247* (2013.01); *G09G 2320/045* (2013.01)

(56) References Cited

U.S. PATENT DOCUMENTS

| | | | | |
|---|---|---|---|---|
| 9,007,281 | B2* | 4/2015 | Yoon | G09G 3/3233 |
| | | | | 345/76 |
| 9,542,890 | B2* | 1/2017 | Nakayama | G09G 3/3233 |
| 10,276,094 | B2* | 4/2019 | Xiang | G09G 3/3258 |
| 10,685,601 | B2* | 6/2020 | Yamamoto | G09G 3/3233 |
| 10,978,001 | B2* | 4/2021 | In | G09G 3/3291 |
| 11,049,439 | B2* | 6/2021 | Lo | G09G 3/2003 |
| 11,189,227 | B1* | 11/2021 | Zhang | G09G 3/3233 |
| 11,227,547 | B2* | 1/2022 | Wu | G09G 3/3258 |
| 11,424,294 | B2* | 8/2022 | Yuan | H10K 59/353 |
| 2016/0372036 | A1* | 12/2016 | Qing | G09G 3/325 |
| 2017/0148384 | A1* | 5/2017 | Lee | G09G 3/3233 |
| 2017/0301293 | A1* | 10/2017 | Zhu | G09G 3/3258 |
| 2018/0151123 | A1* | 5/2018 | Li | G09G 3/3233 |
| 2018/0197934 | A1* | 7/2018 | Chen | H10K 59/1213 |
| 2019/0304361 | A1 | 10/2019 | Lu | |
| 2020/0410924 | A1* | 12/2020 | Xiong | G09G 3/32 |
| 2021/0272499 | A1* | 9/2021 | Shen | G09G 3/2003 |
| 2021/0375203 | A1* | 12/2021 | Chen | G09G 3/204 |
| 2022/0122531 | A1* | 4/2022 | Zheng | G09G 3/3233 |
| 2023/0154402 | A1* | 5/2023 | Zheng | H10K 59/131 |
| | | | | 345/206 |

FOREIGN PATENT DOCUMENTS

| | | |
|---|---|---|
| CN | 110751927 | 2/2020 |
| CN | 111354301 | 6/2020 |
| CN | 111445857 | 7/2020 |
| CN | 112542126 | 3/2021 |
| CN | 112652633 | 4/2021 |
| CN | 113270078 | 8/2021 |
| CN | 113325646 | 8/2021 |
| CN | 214336300 | 10/2021 |
| CN | 113725274 | 11/2021 |
| CN | 113990257 | 1/2022 |
| CN | 114005400 | 2/2022 |
| CN | 114038381 | 2/2022 |
| CN | 114170959 | 3/2022 |
| JP | 2013-104908 | 5/2013 |
| KR | 10-2020-0019529 | 2/2020 |
| KR | 10-2020-0074739 | 6/2020 |

OTHER PUBLICATIONS

Notification of Office Action and Search Report Dated Mar. 6, 2023 From the State Intellectual Property Office of the People's Republic of China Re. Application No. 202210494260.3 and Its Translation Into English. (17 Pages).

Huang et al. "Design and Simulation of 4 TFT Pixel Electrode Circuit for Active Matrix OLED", Chinese Journal of Liquid Crystals and Displays, 20(4): 30-35, Aug. 2005. & English Abstract.

* cited by examiner

DISPLAY PANEL FOR REDUCING FLICKERING DISPLAY

RELATED APPLICATIONS

This application is a National Phase of PCT Patent Application No. PCT/CN2022/092727 having International filing date of May 13, 2022, which claims the benefit of priority of Chinese Patent Application No. 202210494260.3 filed on May 7, 2022. The contents of the above applications are all incorporated by reference as if fully set forth herein in their entirety.

FIELD AND BACKGROUND OF THE INVENTION

The present disclosure relates to the field of display technology, and more particularly, to a display panel.

OLED (organic light-emitting diode) display devices are widely used due to their advantages of self-luminescence and flexibility. A conventional OLED display device adopts a driving circuit based on low temperature polysilicon (LTPS) technology to drive pixels. However, in practical implementations, since a transistor connected to a gate of a drive transistor is a double-gate designed transistor, a semiconductor pattern located between a double gate structure is easily coupled by other signals, resulting in a higher electrical potential and an electrical leakage toward the drive transistor during a light-emitting stage. In practical implementations, an electrical leakage of some transistors to the gate of the driving transistor causes an electrical potential of the gate of the driving transistor to increase, and the electrical leakage of some transistors to the gate of the driving transistor causes the electrical potential of the gate of the driving transistor to decrease. As a result, the electrical potential of the gate of the driving transistor is increased, so that a brightness change in one frame is displayed, and a flickering phenomenon appears in a low frequency display.

Therefore, a conventional display panel has a problem of a flickering display caused by an unbalanced effect of electrical leakages of different transistors toward the gate of the drive transistor.

SUMMARY OF THE INVENTION

The present application provides a display panel for reducing a problem of a flickering display caused by unbalanced effects of electrical leakages of different transistors on a gate of a drive transistor in a conventional display panel.

In order to overcome the above-mentioned problems, the present invention provides technical solutions in as follows.

The present application provides a display panel, wherein the display panel includes a plurality of light-emitting elements arranged in an array and a pixel driving circuit driving the plurality of light-emitting elements, and the pixel driving circuit includes:
  a first initialization transistor connected to a first initialization signal line and configured for inputting a first initialization signal to a first node under a control of a first scan signal;
  a switch transistor for inputting a data signal to a second node under a control of a second scan signal;
  a drive transistor electrically connected to the first node and the second node and configured for driving the plurality of light-emitting elements to emit light under a control of an electrical potential of the first node and an electrical potential of the second node; and
  a compensation transistor connected to the drive transistor through the first node and a third node and configured for compensating a threshold voltage of the drive transistor under a control of a third scan signal.

The compensation transistor includes at least two sub-channels, and a width-to-length ratio of a sub-channel of the compensation transistor adjacent to the drive transistor is less than a width-to-length ratio of a channel of the first initialization transistor.

In some embodiments, the first initialization transistor includes at least two sub-channels, and the width-to-length ratio of the sub-channel of the compensation transistor adjacent to the drive transistor is less than a width-to-length ratio of a sub-channel of the first initialization transistor adjacent to the drive transistor.

In some embodiments, the compensation transistor includes a first channel, the first initialization transistor includes a second channel, the first channel includes at least a first sub-channel and a second sub-channel, the second channel includes at least a third sub-channel and a fourth sub-channel, the first sub-channel is located on a side of the second sub-channel adjacent to the drive transistor, the third sub-channel is located on a side of the fourth sub-channel adjacent to the drive transistor, a width-to-length ratio of the first sub-channel is less than a width-to-length ratio of the third sub-channel, and a width-to-length ratio of the first channel is less than a width-to-length ratio of the second channel of the first initialization transistor.

In some embodiments, the width-to-length ratio of the first sub-channel is less than the width-to-length ratio of the second sub-channel, and the width-to-length ratio of the third sub-channel is greater than a width-to-length ratio of the fourth sub-channel.

In some embodiments, the width-to-length ratio of the second sub-channel is equal to the width-to-length ratio of the fourth sub-channel, or the width-to-length ratio of the second sub-channel is less than the width-to-length ratio of the fourth sub-channel.

In some embodiments, the width-to-length ratio of the first sub-channel is less than the width-to-length ratio of the second sub-channel, the width-to-length ratio of the third sub-channel is equal to the width-to-length ratio of the fourth sub-channel, and the width-to-length ratio of the second sub-channel is equal to the width-to-length ratio of the fourth sub-channel.

In some embodiments, the width-to-length ratio of the second sub-channel is greater than the width-to-length ratio of the fourth sub-channel, the width-to-length ratio of the first sub-channel is equal to the width-to-length ratio of the second sub-channel, and the width-to-length ratio of the first sub-channel is equal to the width-to-length ratio of the fourth sub-channel.

In some embodiments, the width-to-length ratio of the first sub-channel is equal to the width-to-length ratio of the second sub-channel, and the width-to-length ratio of the third sub-channel is equal to the width-to-length ratio of the fourth sub-channel.

In some embodiments, the compensation transistor includes a first gate and a second gate that are connected and a first active pattern, the first initialization transistor includes a third gate and a fourth gate that are connected and a second active pattern, a first overlapping region of the first active pattern and the first gate is in the first sub-channel, a second overlapping region of the first active pattern and the second gate is in the second sub-channel, a third overlapping region of the second active pattern and the third gate is in the third sub-channel, and a fourth overlapping region of the second active pattern and the fourth gate is in the fourth sub-channel.

A ratio of a width of the first active pattern to a width of the first gate located in the first overlapping region is equal to a ratio of a width of the first active pattern to a width of the second gate located in the second overlapping region, a ratio of a width of the second active pattern to a width of the third gate located in the third overlapping region is equal to a ratio of a width of the second active pattern to a width of the fourth gate located in the fourth overlapping region, and a ratio of the width of the first active pattern to the width of the first gate located in the first overlapping region is less than a ratio of the width of the second active pattern to the width of the third gate located in the third overlapping region.

In some embodiments, the width of the first gate located in the first overlapping region is equal to the width of the second gate located in the second overlapping region, the width of the third gate located in the third overlapping region is equal to the width of the fourth gate located in the fourth overlapping region, and the width of the first gate located in the first overlapping region is greater than the width of the third gate located in the third overlapping region.

In some embodiments, the width of the first active pattern located in the first overlapping region is equal to the width of the first active pattern located in the second overlapping region, the width of the second active pattern located in the third overlapping region is equal to the width of the second active pattern located in the fourth overlapping region, and the width of the first active pattern located in the first overlapping region is equal to the width of the second active pattern located in the third overlapping region.

In some embodiments, the width of the first active pattern located in the first overlapping region is equal to the width of the first active pattern located in the second overlapping region, the width of the second active pattern located in the third overlapping region is equal to the width of the second active pattern located in the fourth overlapping region, and the width of the first active pattern located in the first overlapping region is equal to the width of the second active pattern located in the third overlapping region.

In some embodiments, the width of the first gate located in the first overlapping region is equal to the width of the second gate located in the second overlapping region, the width of the third gate located in the third overlapping region is equal to the width of the fourth gate located in the fourth overlapping region, and the width of the first gate located in the first overlapping region is equal to or greater than the width of the third gate located in the third overlapping region.

In some embodiments, the first initialization transistor is a low temperature polysilicon thin-film transistor, the compensation transistor is a low temperature polysilicon thin film transistor, the compensation transistor includes the first gate and the second gate, the first initialization transistor includes the third gate and the fourth gate, a gap is between a projection of the first gate and a projection of the second gate on the first active pattern, and a gap is between a projection of the third gate and a projection of the fourth gate on the second active pattern.

In some embodiments, adjacent pixel driving circuits horizontally arranged are symmetrically arranged, the first initialization transistor in each of the adjacent pixel driving circuits are connected to a same initialization signal line, and the compensation transistor in each of the adjacent pixel driving circuits are connected to a same scan line.

In some embodiments, the pixel driving circuit further includes a second initialization transistor, wherein the second initialization transistor is connected to a second initialization signal line and configured for inputting a second initialization signal to an anode of each of the plurality of light-emitting elements under a control of a fourth scan signal;
a first light emission control transistor connected to the drive transistor through the second node and configured for conducting a current flowing from a power supply high-potential signal line to the drive transistor under a control of a light emission control signal; and
a second light emission control transistor connected to the drive transistor through the third node and configured for conducting a current flowing from the drive transistor to the anode of the light-emitting device under a control of the light emission control signal.

In some embodiments, the pixel driving circuit further includes a storage capacitor, an end of the storage capacitor is connected to the power supply high-potential signal line, and another end of the storage capacitor is connected to the first node.

In some embodiments, the display panel includes:
a substrate; and
a pixel driving circuit layer including a plurality of pixel driving circuits;

Each of the plurality of pixel driving circuits includes a semiconductor layer, a first metal layer, a second metal layer, and a third metal layer that are sequentially arranged in stack on the substrate, the semiconductor layer includes the first active pattern and the second active pattern, and the first metal layer includes the first gate, the second gate, the third gate, and the fourth gate.

In some embodiments, the second metal layer is formed with an electrode plate of a storage capacitor.

In some embodiments, the third metal layer is formed with a source and a drain.

The present application provides the display panel. The display panel includes the plurality of light-emitting elements arranged in an array and the pixel driving circuit for driving the light-plurality of emitting elements. The pixel driving circuit includes the first initialization transistor, the switch transistor, a drive transistor, and a compensation transistor. The first initialization transistor is connected to the first initialization signal line and configured for inputting the first initialization signal to the first node under the control of the first scan signal. The switch transistor is configured for inputting the data signal to the second node under the control of the second scan signal. The drive transistor is electrically connected to the first node and the second node and configured for driving the plurality of light-emitting elements to emit light under the control of the electrical potential of the first node and the electrical potential of the second node. The compensation transistor is connected to the drive transistor through the first node and the third node and configured for compensating the threshold voltage of the drive transistor under the control of the third scan signal. The compensation transistor includes at least two sub-channels, a width-to-length of the sub-channel of the compensation transistor adjacent to the drive transistor is less than the width-to-length of the channel of the first initialization transistor. In the present application, through having the width-length ratio of the first channel of the compensation transistor less than the width-to-length ratio of the first initialization transistor, and having the width-to-length ratio of the first sub-channel less than the width-length ratio of the third sub-channel, the effect of the electrical leakage of the compensation transistor on the gate of the drive transistor can be decreased or the effect of the electrical leakage of the first initialization transistor on the gate of the drive transistor can be increased, so that the effect of the increase in the electrical potential of the gate of the drive transistor affected by the electrical leakage of the compensation transistor is canceled by the effect of the decrease in the electrical potential of the gate of the drive transistor affected by the electrical leakage of the first initialization transistor, thereby preventing the electrical leakage of each of the transistors from causing changes in the electrical potential of the gate of the drive transistor and reducing the problem of the flickering display.

DETAILED DESCRIPTION OF SPECIFIC EMBODIMENTS OF THE INVENTION

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the present application.

Aiming at a problem of a flickering display caused by an unbalanced effect of electrical leakages of different transistors on a gate of a drive transistor in a conventional display panel, embodiments of the present application provide a display panel and a display device to reduce an above-mentioned technical problem.

Figure 1:
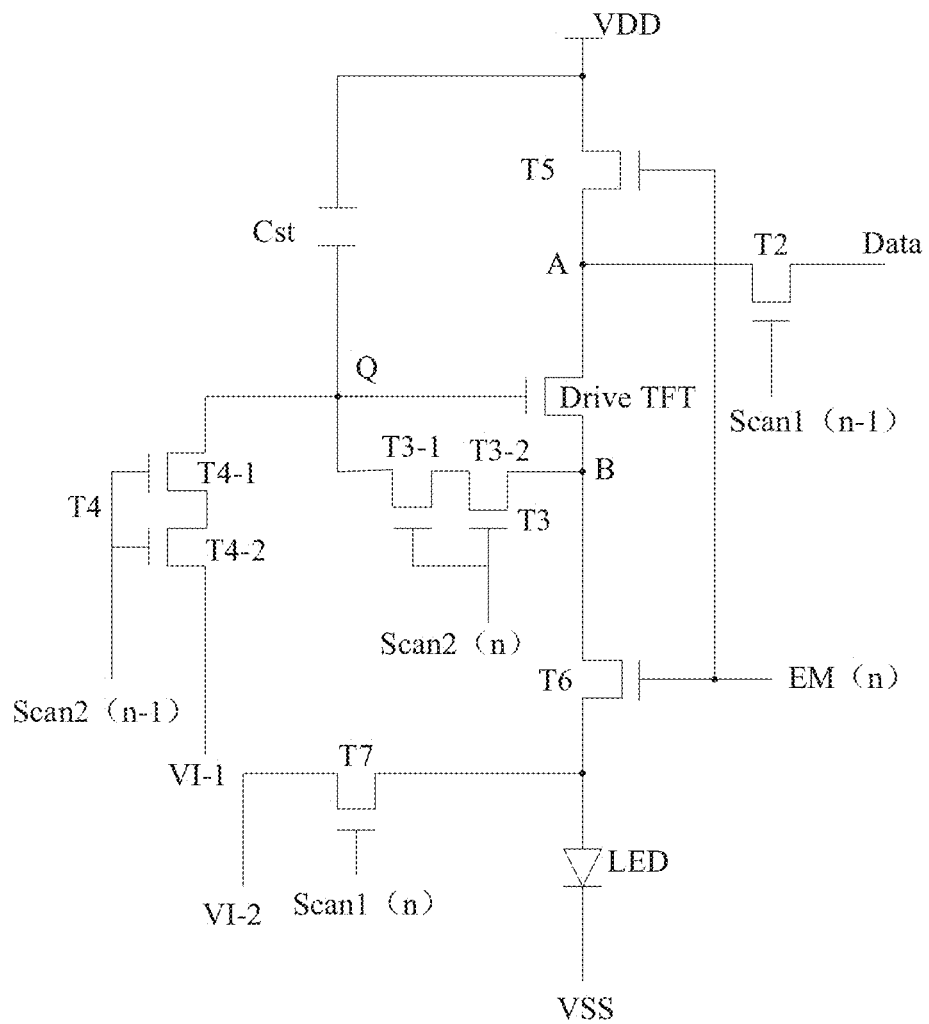
FIG. 1 is a circuit diagram of a display panel provided by an embodiment of the present application.
Figure 2:
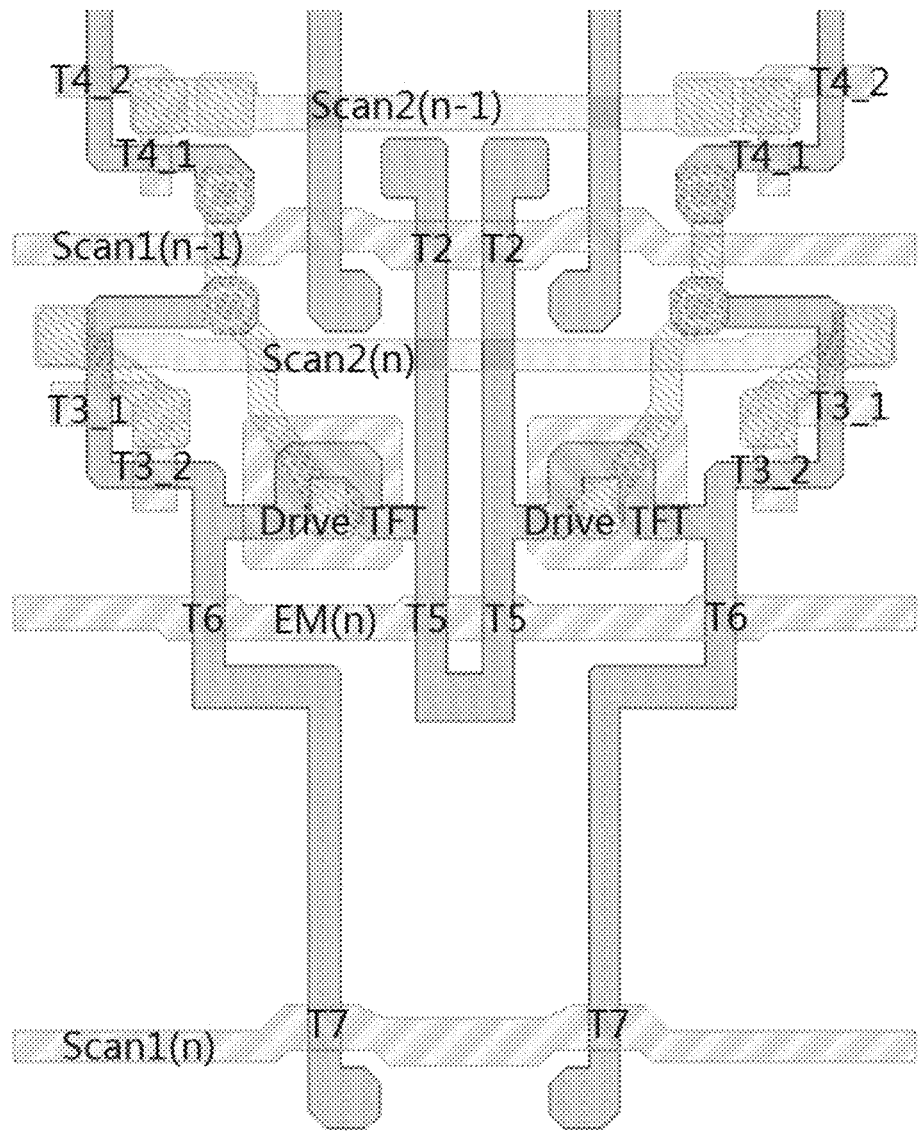
FIG. 2 is a first perspective view of the display panel provided by an embodiment of the present application.
Figure 7:
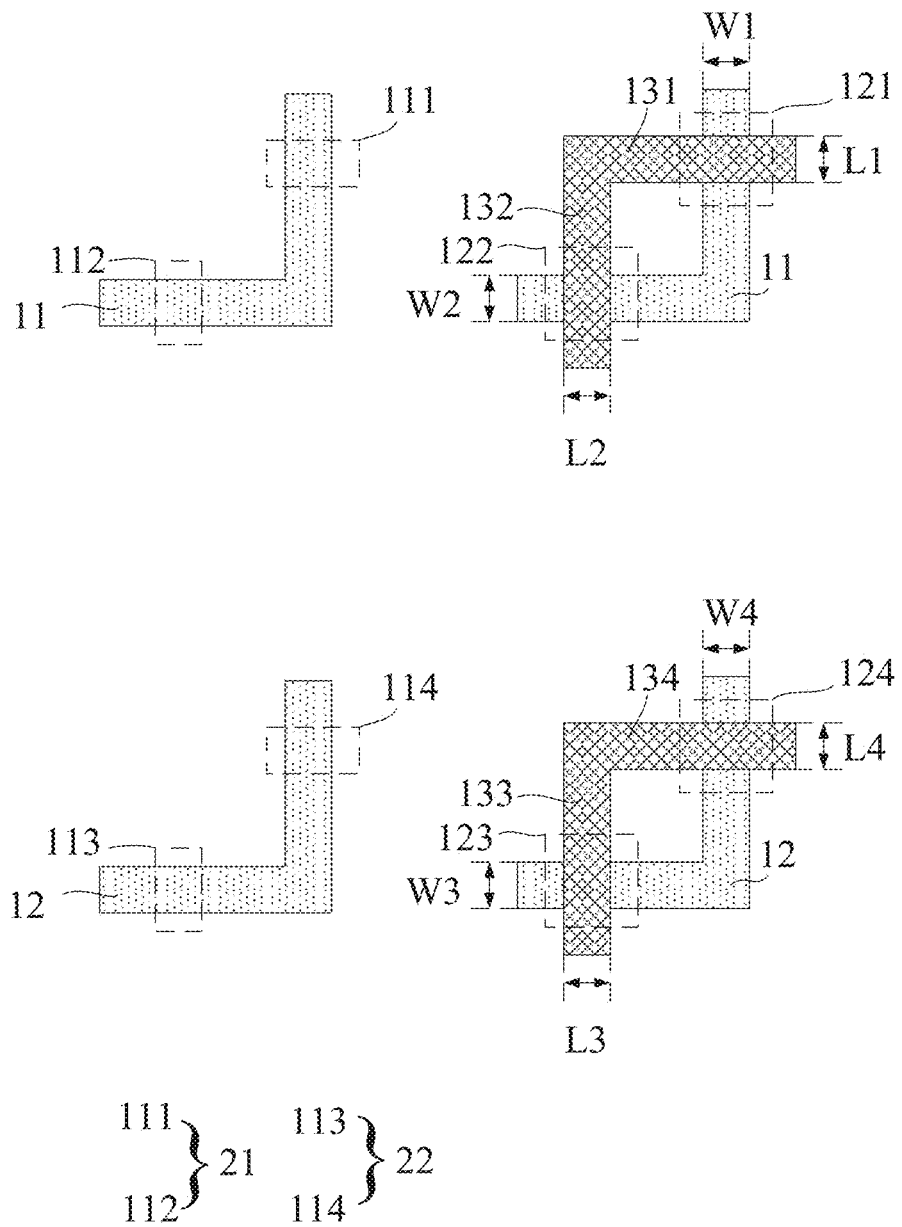
FIG. 7 is a schematic view of gates and active patterns in the display panel of FIG. 2.

As shown in FIG. 1, FIG. 2, and FIG. 7, an embodiment of the present application provides a display panel, the display panel includes a plurality of light-emitting elements LED arranged in an array and a pixel driving circuit for driving the plurality of light-emitting elements LED, the pixel driving circuit includes:

a first initialization transistor T4 connected to a first initialization signal line VI-1 and configured for inputting a first initialization signal to a first node Q under a control of a first scan signal;

a switch transistor T2 for inputting a data signal to a second node A under a control of a second scan signal;

a drive transistor Drive TFT connected to the first node Q and the second node A and configured for driving the plurality of light-emitting elements LED to emit light under a control of an electrical potential of the first node Q and an electrical potential of the second node A; and a compensation transistor T3 connected to the drive transistor Drive TFT through the first node Q and the third node B and configured for compensating a threshold voltage of the drive transistor Drive TFT under a control of a third scan signal.

The compensation transistor T3 includes at least one sub-channel, and a width-to-length ratio of a sub-channel of the compensation transistor T3 adjacent to the drive transistor Drive TFT is less than a width-to-length ratio of a channel of the first initialization transistor T4.

An embodiment of the present application provides a display panel, which can decrease an effect of an electrical leakage of the compensation transistor on a gate of the drive transistor or increase an effect of an electrical leakage of the first initialization transistor on the gate of the drive transistor through arranging the width-to-length ratio of the sub-channel of the compensation transistor adjacent to the drive transistor less than the width-to-length ratio of the channel of the first initial transistor, so that an effect of an increase in an electric potential of the gate of the drive transistor affected by the electrical leakage of the compensation transistor is canceled by an effect of a decrease in the electrical potential of the gate of the drive transistor affected by the electrical leakage of the first initialization transistor, thereby preventing an electrical leakage of each transistor from causing changes in the electrical potential of the gate of the drive transistor and reducing the problem of the flickering display.

In an embodiment, the first initialization transistor includes at least two sub-channels, and the width-to-length ratio of the sub-channel of the compensation transistor adjacent to the drive transistor is less than a width-to-length ratio of a sub-channel of the first initialization transistor adjacent to the drive transistor. Since an electrical leakage toward the drive transistor and an electrical leakage from the drive transistor are mainly related to sub-channels of thin-film transistor directly connected to the drive transistor, making the width-to-length ratio of the sub-channel of the compensation transistor connected to the drive transistor less than the width-to-length ratio of the sub-channel of the first initialization transistor cancels an effect of the compensation transistor and the first initialization transistor on the electrical potential of the gate of the drive transistor, thereby reducing the problem of the flickering display.

In one embodiment, as shown in FIGS. 1-7, the compensation transistor T3 includes a first channel 21. The first initialization transistor T4 includes a second channel 22. The first channel 21 at least includes a first sub-channel 111 and a second sub-channel 112. The second sub-channel 22 includes at least a third sub-channel 113 and a fourth sub-channel 114. The first sub-channel 111 is located on a side of the second sub-channel 112 adjacent to the drive transistor Drive TFT. The third sub-channel 113 is located on a side of the fourth sub-channel 114 adjacent to the drive transistor Drive TFT. A width-to-length ratio of the first sub-channel 111 is less than a width-to-length ratio of the third sub-channel 113 (e.g., W1/L1 can be less than W3/L3, as shown in FIG. 7). A width-to-length ratio of the first channel 21 is less than a width-to-length ratio of the second channel 22 (e.g., W1/L1+W2/L2 can be less than W3/L3+W4/L4, as shown in FIG. 7). Through having the width-to-length ratio of the first sub-channel less than the width-to-length ratio of the third sub-channel, and making the width-to-length ratio of the first channel less than the width-to-length ratio of the second channel, the effect of the increase in the electrical potential of the gate of the drive transistor affected by the electrical leakage of the compensation transistor is close to or even equal to the effect of the decrease in the electrical potential of the gate of the drive transistor affected by the electrical leakage of the first initialization transistor, thereby reducing the problem of the flickering display.

Regarding a problem of an electrical leakage unbalance of the compensation transistor and the first initialization transistor causing changes in the electrical potential of the gate of the drive transistor, in an embodiment, the width-to-length ratio of the first sub-channel is less than the width-to-length ratio of the second sub-channel, and the width-to-length ratio of the third sub-channel is greater than the width-to-length ratio of the fourth sub-channel. Through having the width-to-length ratio of the first sub-channel less than the width-to-length ratio of the second sub-channel, the electrical leakage of the first sub-channel of the compensation transistor is reduced, thereby reducing an effect of the electrical leakage of the compensation transistor on the gate of the drive transistor. Through having the width-to-length ratio of the third sub-channel greater than the width-to-length ratio of the fourth sub-channel, the electrical leakage of the third sub-channel of the first initialization transistor is increased, thereby increasing the effect of the electrical leakage of the first initialization transistor on the gate of the drive transistor, so that the effect of the increase in the electric potential of the gate of the drive transistor affected by the electrical leakage of the compensation transistor is balanced with the effect of the decrease in the electrical potential of the gate of the drive transistor affected by the electrical leakage of the first initialization transistor. Therefore, the electrical potential of the gate of the drive transistor is prevented from being affected, thereby reducing the problem of the flickering display.

Figure 8:
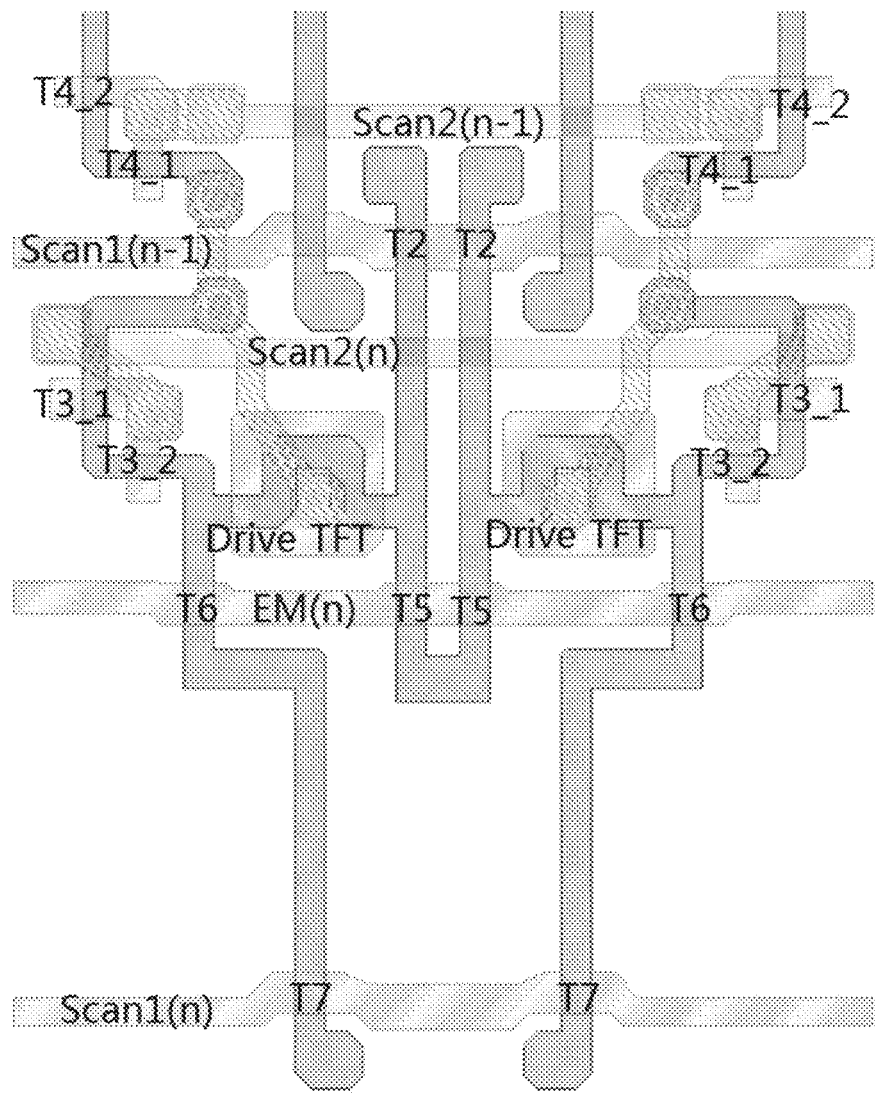
FIG. 8 is a second perspective view of the display panel provided by an embodiment of the present application.

Specifically, as shown in FIG. 8, the width-to-length ratio of the first sub-channel can be reduced by increasing a width of the first gate, and the width-to-length ratio of the third sub-channel can be increased by reducing a width of the third gate, so that the width-to-length ratio of the first sub-channel is less than the width-to-length ratio of the second sub-channel, the width-to-length ratio of the third sub-channel is greater than the width-to-length ratio of the fourth sub-channel, and the effect of the increase in the electric potential of the gate of the drive transistor affected by the electrical leakage of the compensation transistor is balanced with the effect of the decrease in the electrical potential of the gate of the drive transistor affected by the electrical leakage of the first initialization transistor, thereby preventing the electrical potential of the gate of the drive transistor from being affected by the electrical leakage that causes the display flicker. Since the width-to-length ratio of the first sub-channel decreases and the width-to-length ratio of the third sub-channel increases, the effects of the compensation transistor and the first initialization transistor on the gate of the drive transistor are close or equal to each other, and the problem of the flickering display is reduced.

In an embodiment, the width-to-length ratio of the second sub-channel is equal to the width-to-length ratio of the fourth sub-channel, or the width-to-length ratio of the second sub-channel is less than the width-to-length ratio of the fourth sub-channel. Through arranging the width-to-length ratio of the second sub-channel equal to the width-to-length ratio of the fourth sub-channel, changing a design of the second sub-channel and the fourth sub-channel is not required. Through having the width-to-length ratio of the second sub-channel less than the width-to-length ratio of the fourth sub-channel, a difference between the width-to-length ratio of the first channel of the compensation transistor and the width-to-length ratio of the second channel of the first initialization transistor is further increased, so that the effect of the electrical leakage of the compensation transistor on the gate of the drive transistor is balanced with the effect of the electrical leakage of the first initialization transistor on the gate of the drive transistor, and the problem of the flickering display is reduced.

Regarding the problem of the electrical leakage unbalance of the compensation transistor and the first initialization transistor causing changes in the electrical potential of the gate of the drive transistor, in an embodiment, the width-to-length ratio of the first sub-channel is less than the width-to-length ratio of the second sub-channel, and the width-to-length ratio of the third sub-channel is equal to the width-to-length ratio of the fourth sub-channel. Through having the width-to-length ratio of the first sub-channel less than the width-to-length ratio of the second sub-channel, only a design of the first sub-channel of the compensation transistor is required to be changed without changing a design of the first initialization transistor, thereby reducing the effect of the electrical leakage of the compensation transistor on the electrical potential of the gate of the drive transistor, so that the effect of the increase in the electrical potential of the gate of the drive transistor affected by the electrical leakage of the compensation transistor is canceled by the effect of the decrease in the electrical potential of the gate of the drive transistor affected by the electrical leakage of the first initialization transistor, thereby reducing the problem of the flickering display.

Figure 9:
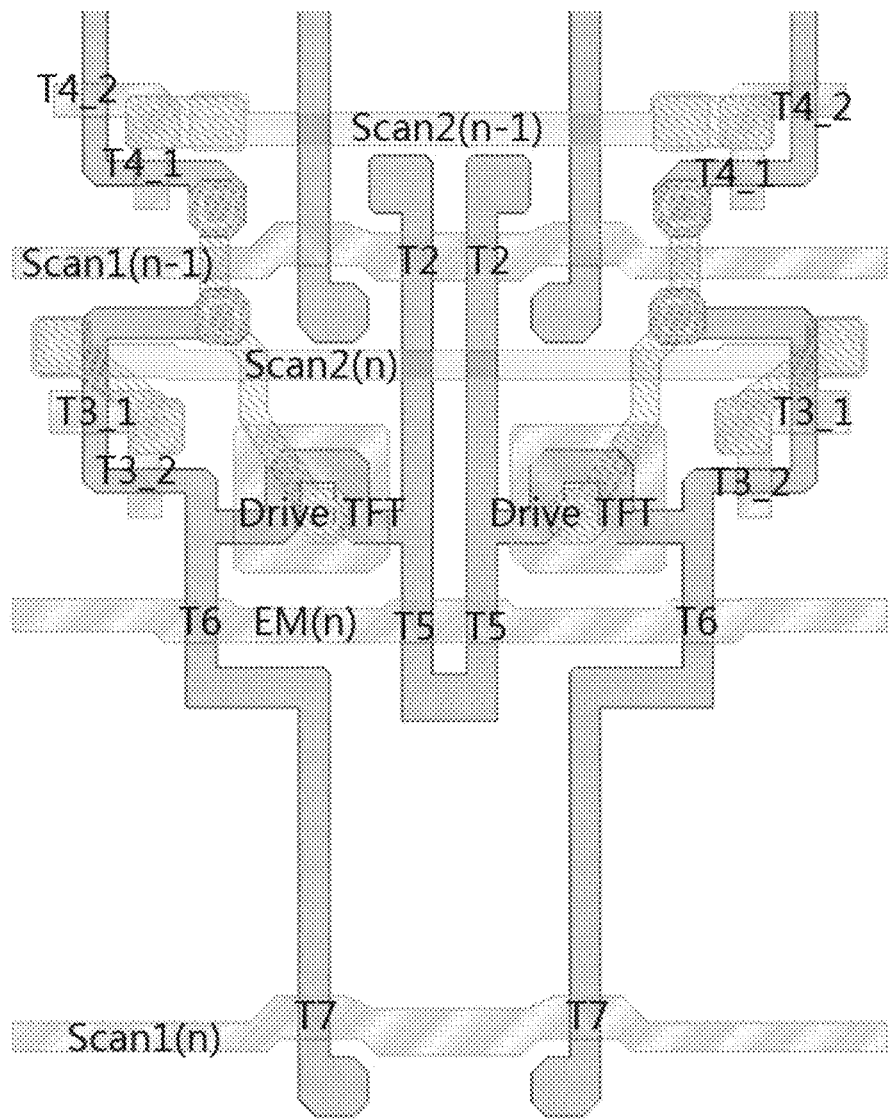
FIG. 9 is a third perspective view of the display panel provided by an embodiment of the present application.

Specifically, as shown in FIG. 9, the width of the first gate can be increased, and the width-to-length ratio of the first sub-channel can be reduced, so as to reduce the effect of the electrical leakage of the compensation transistor on the electrical potential of the gate of the drive transistor, thereby reducing the problem of the flickering display.

Regarding the problem of the electrical leakage unbalance of the compensation transistor and the first initialization transistor causing changes in the electrical potential of the gate of the drive transistor, in an embodiment, the width-to-length ratio of the third sub-channel is greater than the width-to-length ratio of the fourth sub-channel, and the width-to-length ratio of the first sub-channel is equal to the width-to-length ratio of the second sub-channel. Through having the width-to-length ratio of the third sub-channel greater than the width-to-length ratio of the fourth sub-channel, and increasing the width-to-length ratio of the third sub-channel, the effect of the electrical leakage of the first initialization transistor on the electrical potential of the gate of the drive transistor is increased, so that the effect of the increase in the electric potential of the gate of the drive transistor affected by the electrical leakage of the compensation transistor is balanced with the effect of the decrease in the electrical potential of the gate of the drive transistor affected by the electrical leakage of the first initialization transistor, thereby reducing the problem of the flickering display.

Figure 10:
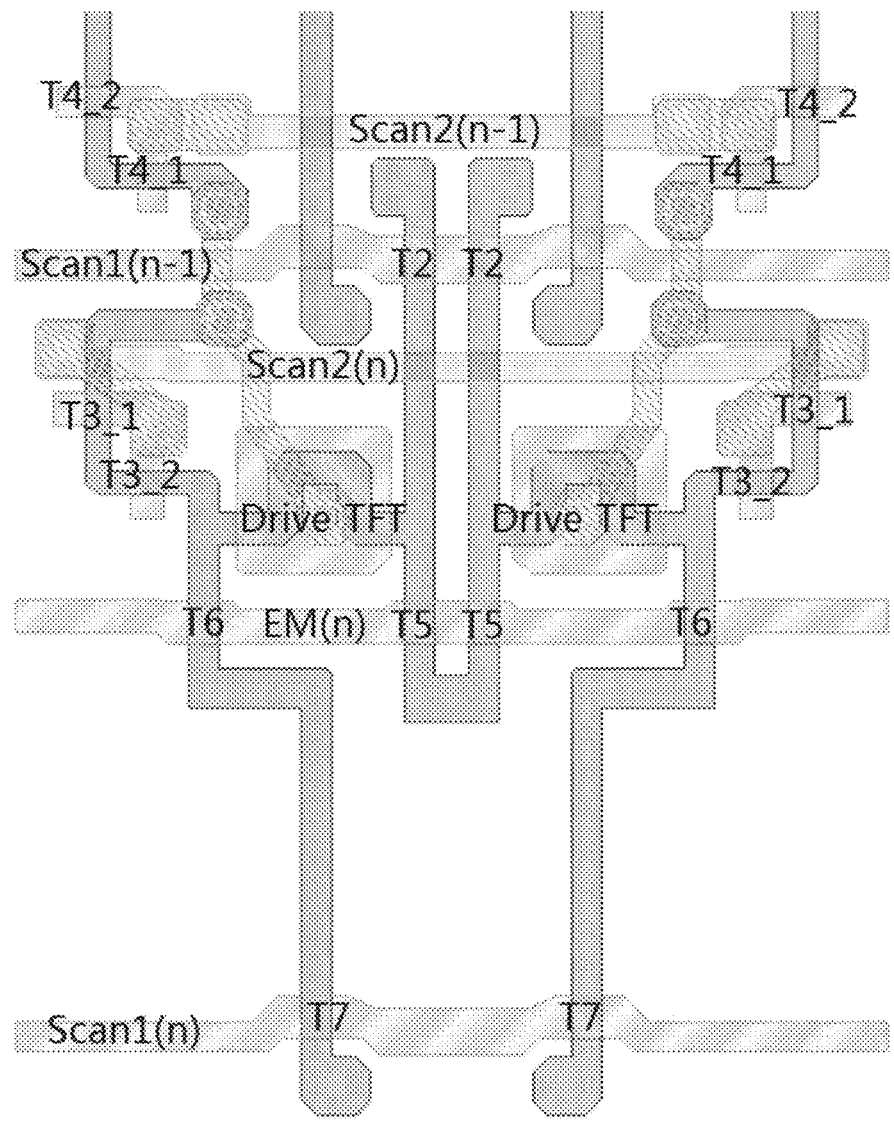
FIG. 10 is a fourth perspective view of the display panel provided by an embodiment of the present application.

Specifically, as shown in FIG. 10, through increasing the width of the third gate of the initialization transistor T4_directly connected to the drive transistor, the width-tolength ratio of the third sub-channel can be increased, so that the effect of the decrease in the electrical potential of the gate of the drive transistor affected by the electrical leakage of the first initialization transistor is balanced with the effect of the increase in the electrical potential of the gate of the drive transistor affected by the electrical leakage of the compensation transistor, thereby reducing the problem of the flickering display.

Regarding the problem of the electrical leakage unbalance of the compensation transistor and the first initialization transistor causing changes in the electrical potential of the gate of the drive transistor, in an embodiment, the width-to-length ratio of the first sub-channel is equal to the width-to-length ratio of the second sub-channel, and the width-to-length ratio of the third sub-channel is equal to the width-to-length ratio of the fourth sub-channel. Through having the width-to-length ratio of the first sub-channel equal to the width-to-length ratio of the second sub-channel, and having the width-to-length ratio of the third sub-channel equal to the width-to-length ratio of the fourth sub-channel, the width-to-length ratio of the first sub-channel and the width-to-length ratio of the second sub-channel can be decreased, and/or the width-to-length ratio of the third sub-channel and the width-to-length ratio of the fourth sub-channel can be increased, so that the effect of the increase in the electrical potential of the gate of the drive transistor affected by the electrical leakage of the compensation transistor is reduced, and/or the effect of the decrease in the electrical potential of the gate of the drive transistor affected by the electrical leakage of the first initialization transistor is increased, so that the effects of the compensation transistor and the first initialization transistor on the gate of the drive transistor are canceled by each other, and the problem of the flickering display is reduced.

In an embodiment, as shown in FIGS. 1-7, the compensation transistor T3 includes a first gate 131 and a second gate 132 that are connected and the first active pattern 11. The first initialization transistor T4 includes the third gate 133 and the fourth gate 134 that are connected and the second active pattern 12. A first overlapping region 121 is between the first active pattern 11 and the first gate 131 in the first sub-channel 111, a second overlapping region 122 is between the first active pattern 11 and the second gate 132 in the second sub-channel 112, a third overlapping region 123 is between the second active pattern 12 and the third gate 133 in the third sub-channel 113, and a fourth overlapping region 124 is between the second active pattern 12 and the fourth gate 134 in the fourth sub-channel 114;

A ratio W1/L1 of a width W1 of the first active pattern 11 to the width L1 of the first gate 131 located in the first overlapping region 121 is equal to a ratio W2/L2 of a width W2 of the first active pattern 11 to a width L2 of the second gate 132 located in the second overlapping region 122. A ratio W3/L3 of a width W3 of the second active pattern 12 and a width L3 of the third gate 133 in the third overlapping region 123 is equal to a ratio W4/L4 of a width W4 of the second active pattern 12 to a width L4 of the fourth gate 134 located in the fourth overlapping region 124. The ratio W1/L1 of the width W1 of the first active pattern 11 to the width L1 of the first gate 131 located in the first overlapping region 121 is less than the ratio W3/L3 of the width W3 of the second active pattern 12 and the third gate the width L3 located in the third overlapping region 123. Through having the ratio of the width of the first active pattern to the width of the first gate of the first overlapping region less than the ratio of the width of the second active pattern to the width of the third gate of the third overlapping region, the width-to-length ratio of the first channel of the compensation transistor is less than the width-to-length ratio of the second channel of the first initialization transistor, so that the effect of the electrical leakage of the compensation transistor on the gate of the drive transistor is reduced relative to the effect of the electrical leakage of the first initialization transistor on the gate of the drive transistor, and the effects of the compensation transistor and the first initialization transistor on the gate of the drive transistor are balanced with each other, thereby reducing the problem of the flickering display.

It should be noted that, in FIGS. 1-6, T3-1 and T3-2 respectively represent portions of the compensation transistor T3 corresponding to the first gate and the second gate, and T4-1 and T4-2 respectively represent portions of the initialization transistor T4 corresponding the third gate and the fourth gate. In FIG. 7, gates and active patterns of the compensation transistor and the first initialization transistor are illustrated for describing the compensation transistor and the first initialization transistor in details as described specifically in following embodiments.

It should be noted that, as can be seen from both FIG. 1 and FIG. 2, two gates of the compensation transistor T3 are connected. Therefore, in FIG. 1 and FIG. 2, the first gate and the second gate are two portions of a gate, take FIG. 2 for an example, the first gate and the second gate are two portions of a gate that are perpendicular to each other. Similarly, the third gate and the fourth gate of the first initialization transistor T4 are also two portions of the gate that are perpendicular to each other. Therefore, in order to specifically describe corresponding portions of the first gate, the second gate, the third gate, and the fourth gate, the first gate, the second gate, the third gate, and the fourth gate are respectively denoted by reference numeral 131, reference numeral 132, reference numeral 133, and reference numeral 134, as shown in FIG. 7.

It should be noted that, as shown in FIG. 7, a width of each portion of the first active pattern in a horizontal direction equals to one another, the width of the each portion of the first active pattern in the horizontal direction equals to one another, a width of each portion of the first active pattern in a vertical direction equals to one another, and a width of each portion of the second active pattern in a vertical direction equals to one another. A width of each portion in the first gate equals to one another, a width of each portion in the second gate equals to one another, a width of each portion in the third gate equals to one another, a width of each portion in the fourth gate equals to one another. However, embodiments of the present application is not limited thereto. For example, a width of a gate located in an overlapping region and a width of a gate located in a non-overlapping region can be different. For example, the width of the first gate located in the first overlapping region and a width of the first gate located outside the first overlapping region are not equal.

Specifically, when widths of each of a plurality of portions of each of a plurality of gates are not equal, since the plurality of gates are formed by etching, only a shape of a mask is required to be changed, and no additional process steps are required. In addition, changes of the widths of each of the plurality of gates can be set according to requirements. For example, if the width of the first gate in the first overlapping region needs to be increased, an overall width of the first gate can be increased to reduce the width of the first gate. For example, if the width of the third gate in the third overlapping region needs to be reduced, only the width of the third gate located in the third overlapping region is reduced without changing or increasing a width of the third gate outside the third overlapping region, thereby preventing an impedance of the third gate from increasing. Similarly, designs of the second gate and the fourth gate can also adopt a same manner as mentioned above, and details will not be reiterated herein.

In an embodiment, as shown in FIG. 7, the width L1 of the first gate 131 located in the first overlapping region 121 is equal to the width L2 of the second gate 132 located in the second overlapping region 122, the width L3 of the third gate 133 located in the third overlapping region 123 is equal to the width L4 of the fourth gate 134 located in the fourth overlapping region 124, and the width L1 of the first gate 131 located in the first overlapping region 121 is greater than the width L3 of the third gate 133 located in the third overlapping region 123. Through changing the widths of the plurality of gates of the compensation transistor and/or the first initialization transistor, so that the width-to-length ratio of the channel of the compensation transistor and/or the first initialization transistor is changed, the effect of the compensation transistor and/or the first initialization transistor on the gate of the drive transistor can be adjusted, so that the effects of the compensation transistor and the first initialization transistor on the gate of the drive transistor are canceled by each other, and the problem of the flickering display is reduced.

Specifically, through increasing the width of the first gate located in the first overlapping region and the width of the second gate located in the second overlapping region, the width of the first gate located in the first overlapping region can be greater than the width of the third gate located in the third overlapping region, and since the width of the first gate and the width of the second gate are increased, an impedance of the first gate and an impedance of the second gate can be reduced.

Specifically, through reducing the width of the third gate located in the third overlapping region and the width of the fourth gate located in the fourth overlapping region, the width of the first gate located in the first overlapping region can be greater than the width of the third gate located in the third overlapping region.

Specifically, through simultaneously increasing the width of the first gate located in the first overlapping region and the width of the second gate located in the second overlapping region, the width of the third gate located in the third overlapping region and the width of the fourth gate located in the fourth overlapping region can be reduced. Through reducing the width-to-length ratio of the first channel of the compensation transistor, while increasing the width-to-length ratio of the second channel of the first initialization transistor, the width-to-length ratio of the second channel of the first initialization transistor is increased, so that the effect of the compensation transistor on the electrical potential of the gate of the drive transistor can be reduced, the effect of the first initialization transistor on the electrical potential of the gate of the drive transistor can be increased, and the effects of the compensation transistor and the first initialization transistor on the electrical potential of the gate of the drive transistor are balanced, and the problem of the flickering display is reduced.

In an embodiment, as shown in FIG. 7, the width W1 of the first active pattern 11 located in the first overlapping region 121 is equal to the width W2 of the first active pattern 11 located in the second overlapping region 122, the width W3 of the second active pattern 12 located in the third overlapping region 123 is equal to the width W4 of the second active pattern 12 located in the fourth overlapping region 124, and the width W1 of the first active pattern 11 located in the first overlapping region 121 is equal to the width W3 of the second active pattern 12 located in the third overlapping region 123. Through having the width of the first active pattern and the width of the second active pattern equal to each other, when designing the pixel driving circuit, changing designs of the first active pattern and the second active pattern are not required, and the width-to-length ratio of the channel and the second channel can be adjusted through changing the widths of the gates, so that the effects of the compensation transistor and the first initialization transistor on the electrical potential of the gate of the drive transistor are balanced, and the problem of the flickering display is reduced without changing masks of active patterns.

Regarding the problem of the electrical leakage unbalance of the compensation transistor and the first initialization transistor causing changes in the electrical potential of the gate of the drive transistor, in an embodiment, the width of the first active pattern located in the first overlapping region is equal to the width of the first active pattern located in the second overlapping region, the width of the second active pattern located in the third overlapping region is equal to the width of the second active pattern located in the fourth overlapping region, and the width of the first active pattern located in the first overlapping region is equal to the width of the second active pattern located in the third overlapping region. Through having the width of the first active pattern located in the first overlapping region less than the width of the second active pattern located in the third overlapping region, the effect of the compensation transistor on the electrical potential of the gate of the drive transistor is reduced relative to the effect of the first initialization transistor on the electrical potential of the gate of the drive transistor, so that the effect of the increase in the electrical potential of the gate of the drive transistor affected by the electrical leakage of the compensation transistor is balanced with the effect of the decrease in the electrical potential of the gate of the drive transistor affected by the electrical leakage of the first initialization transistor, thereby reducing the problem of the flickering display.

Specifically, through reducing the width of the first active pattern located in the first overlapping region and the width of the first active pattern located in the second overlapping region, the width-to-length ratio of the first channel of the compensation transistor can be less than the width-to-length ratio of the second channel of the first initialization transistor. Through increasing the width of the second active pattern located in the third overlapping region and the width of the second active pattern located in the fourth overlapping region, the width-to-length ratio of the first channel of the compensation transistor can be less than the width-to-length ratio of the second channel of the first initialization transistor. Furthermore, through reducing the width of the first active pattern located in the first overlapping region and the width of the first active pattern located in the second overlapping region, and at a same time, reducing the width of the second active pattern located in the third overlapping region and the width of the second active pattern located in the fourth overlapping region, the width-to-length ratio of the first channel of the compensation transistor can be reduced and the width-to-length ratio of the second channel of the first initialization transistor can be increased, thereby reducing the effect of the compensation transistor on the electrical potential of the gate of the drive transistor, and increasing the effect of the first initialization transistor on the electrical potential of the gate of the drive transistor, so that the effects of the compensation transistor and the first initialization transistor on the gate of the drive transistor are canceled by each other, and the problem of the flickering display is reduced.

In one embodiment, the width of the first gate located in the first overlapping region is equal to the width of the second gate located in the second overlapping region, the width of the third gate located in the third overlapping region is equal to the width of the fourth gate located in the fourth overlapping region, and the width of the first gate located in the first overlapping region is equal to or greater than the width of the third gate located in the third overlapping region. Through having the width of the first gate located in the first overlapping region equal to the width of the third gate located in the third overlapping region, changing designs of the gates are not necessary and masks of the gate are not required to be changed. The width of the first active pattern located in the first overlapping region is less than the width of the second active pattern located in the third overlapping region, so that the width-to-length ratio of the first channel of the compensation transistor is less than the width-to-length ratio of the second channel of the first initialization transistor, the effect of the electrical leakage of the compensation transistor on the gate of the drive transistor is reduced relative to the effect of the electrical leakage of the first initialization transistor on the gate of the drive transistor, and the effects of the compensation transistor and the first initialization transistor on the gate of the drive transistor are balanced with each other, thereby reducing the problem of the flickering display.

Through having the width of the first gate located in the first overlapping region greater than the width of the third gate located in the third overlapping region, the width-to-length ratio of the first channel of the compensation transistor can be less than the width-to-length ratio of the second channel of an initialization transistor, which further reduces or eliminates the effects of the compensation transistor and the first initialization transistor on the gate of the drive transistor, and reduces the problem of the flickering display.

It should be noted that, in the above embodiments, the width-to-length ratio of the first sub-channel is exemplified as being equal to the width-to-length ratio of the second sub-channel and the width-to-length ratio of the third sub-channel is exemplified as being equal to the width-to-length ratio of the fourth sub-channel for detail descriptions of designs of the gates and the active patterns, but embodiments of the present application are not limited thereto. For example, when the width-to-length ratio of the first sub-channel is less than the width-to-length ratio of the second subchannel, or the width-to-length ratio of the third channel is greater than the width-to-length ratio of the fourth sub-channel, the gates and the active patterns can also be designed in a manner similar to the above-mentioned embodiments.

In an embodiment, the first initialization transistor is a low temperature polysilicon thin-film transistor, the compensation transistor is a low temperature polysilicon thin film transistor, the compensation transistor includes a first gate and a second gate, the first initialization transistor includes a third gate and a fourth gate, a gap is between a projection of the first gate and a projection of the second gate on the first active pattern, and a gap is between a projection of the third gate and a projection of the fourth gate on the second active pattern. The present application adopts a double-gate design for low-temperature polysilicon thin-film transistors. A semiconductor pattern between double gates is easily coupled by other signals, resulting in a high electrical potential and an electrical leakage toward the drive transistor during a light-emitting stage. Through setting a shielding metal, the electrical leakage toward the gate of the drive transistor is reduced, thereby reducing the problem of the flickering display.

In one embodiment, adjacent pixel driving circuits horizontally arranged are symmetrically arranged, the first initialization transistor in each of the adjacent pixel driving circuits are connected to a same initialization signal line, and the compensation transistor in each of the adjacent pixel driving circuits are connected to a same scan line. Through connecting the first initialization transistor in each of the adjacent pixel driving circuits to a same initialization signal line, and connecting the compensation transistors in each of the adjacent pixel driving circuits to a same scanning line, a space occupied by a sub-pixel can be reduced, and an aperture ratio of the display panel can be increased. Since disconnecting portions of a wire between two sub-pixels is not necessary, a difficulty of manufacturing processes is reduced, and a yield of the display panel is increased.

In an embodiment, as shown in FIG. 1 and FIG. 2, the pixel driving circuit further includes a second initialization transistor T7, wherein the second initialization transistor T7 is connected to a second initialization signal line VI-2 and configured for inputting a second initialization signal to an anode of each of the plurality of light-emitting elements LED under a control of a fourth scan signal;
  a first light emission control transistor T5 connected to the drive transistor Drive TFT through the second node A and configured for conducting a current flowing from a power supply high-potential signal line VDD to the drive transistor Drive TFT under a control of a light emission control signal; and
  a second light emission control transistor T6 connected to the drive transistor Drive TFT through the third node B and configured for conducting a current flowing from the drive transistor Drive TFT to the anode of the light-emitting element LED under a control of the light emission control signal.

In an embodiment, the display panel includes:
  a substrate; and
  a pixel driving circuit layer including a plurality of pixel driving circuits.

Each of the plurality of pixel driving circuits includes a semiconductor layer, a first metal layer, a second metal layer, and a third metal layer that are sequentially arranged in stack on the substrate. The semiconductor layer includes the first active pattern and the second active pattern, and the first metal layer includes the first gate, the second gate, the third gate, and the fourth gate.

In one embodiment, the second metal layer is formed with an electrode plate of a storage capacitor.

In one embodiment, the third metal layer is formed with a source and a drain.

Figure 3:
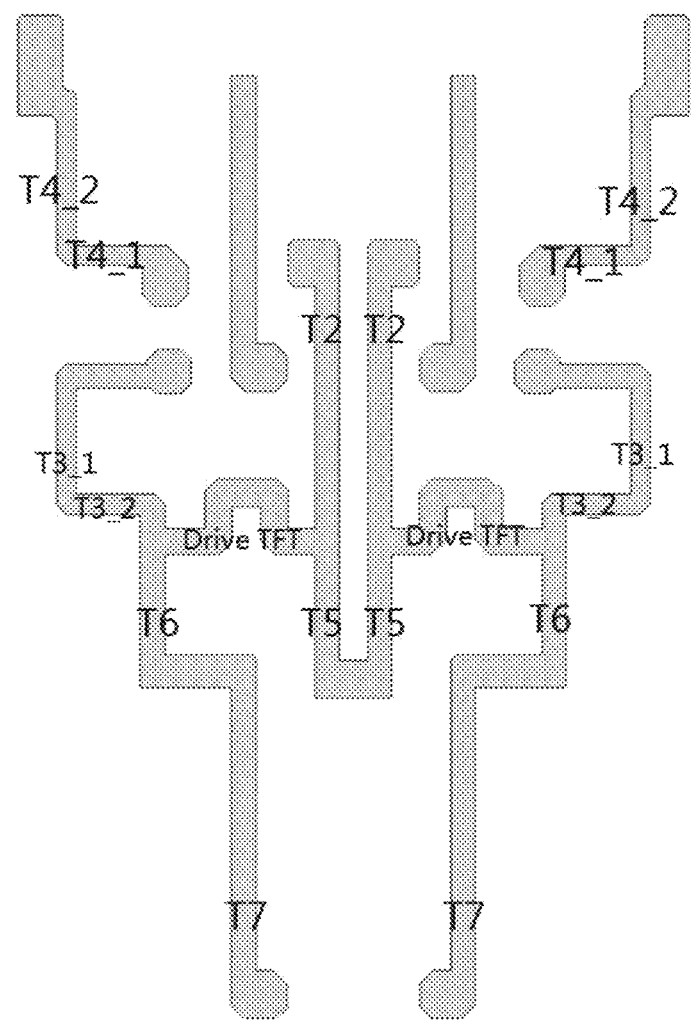
FIG. 3 is an exploded view of a semiconductor layer of the display panel of FIG. 2.
Figure 4:
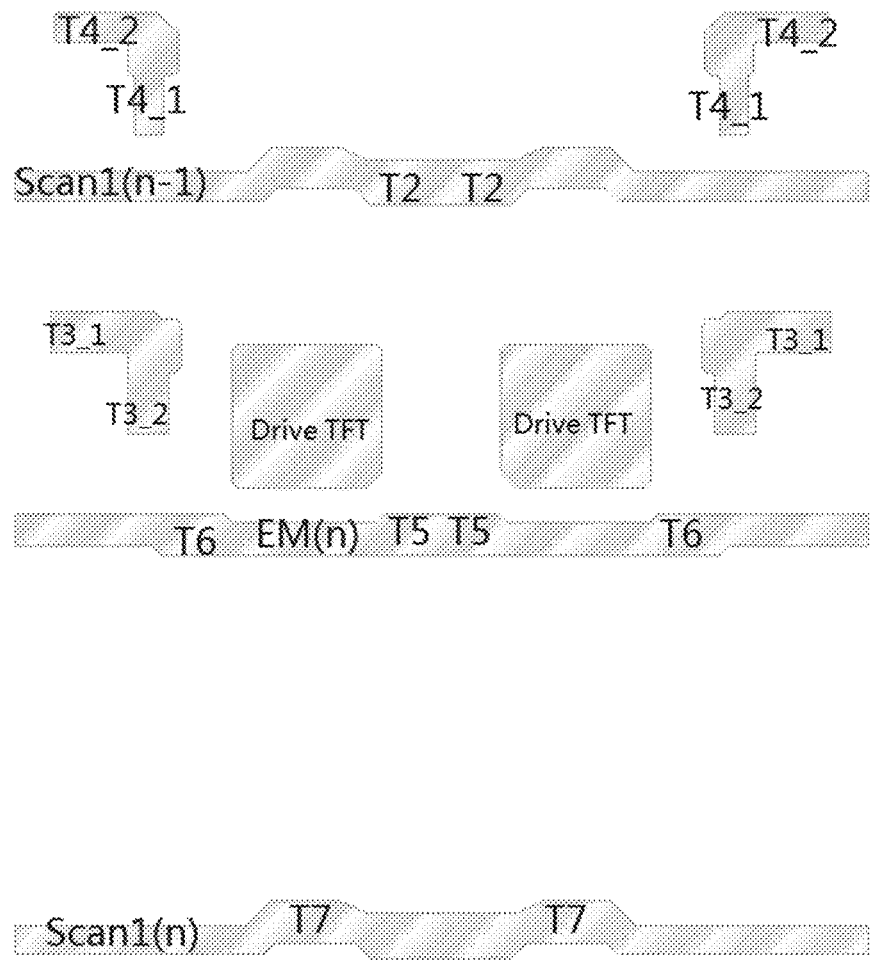
FIG. 4 is an exploded view of a first metal layer of the display panel of FIG. 2.
Figure 5:
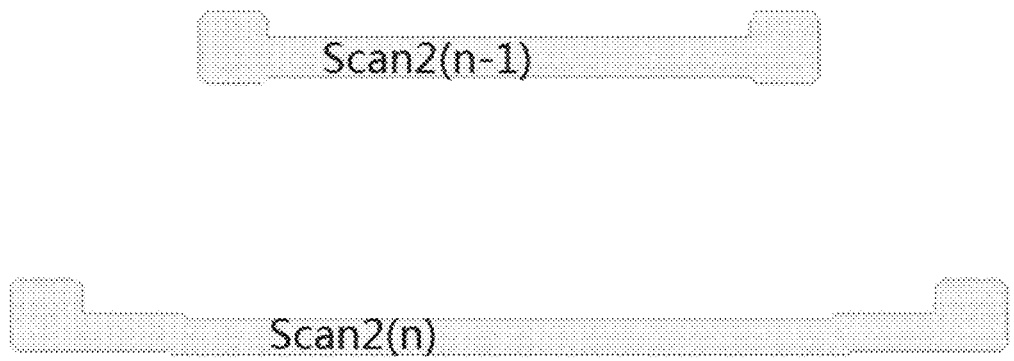
FIG. 5 is an exploded view of a second metal layer of the display panel of FIG. 2.
Figure 6:
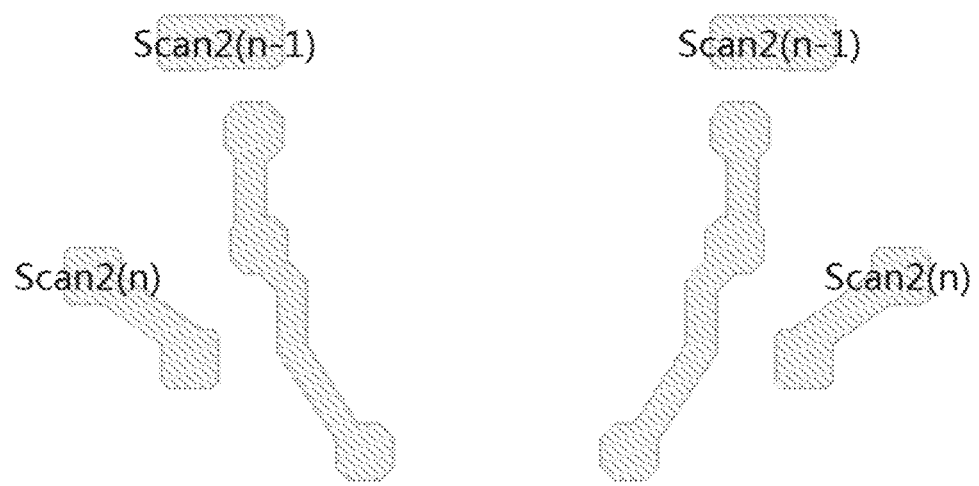
FIG. 6 is an exploded view of a third metal layer of the display panel of FIG. 2.

As shown in FIGS. 3-6, FIG. 3 is an exploded view of a semiconductor layer of the display panel of FIG. 2, FIG. 4 is an exploded view of a first metal layer of the display panel of FIG. 2, FIG. 5 is an exploded view of a second metal layer of the display panel of FIG. 2, and FIG. 6 is an exploded view of a third metal layer of the display panel of FIG. 2.

In one embodiment, as shown in FIG. 1, the pixel driving circuit further includes a storage capacitor Cst, an end of the storage capacitor Cst is connected to the power supply high-potential signal line VDD, and another end of the storage capacitor Cst is connected to the first node Q.

It can be understood that, in this embodiment of the present application, as shown in FIG. 1, a data line Data transmits a data signal, the first initialization signal line VI-1 transmits the first initialization signal, the second initialization signal line VI-2 transmits the second initialization signal, a first scan signal line Scan2(n−1) transmits the first scan signal, a second scan signal line Scan1(n−1) transmits the second scan signal, a third scan signal line Scan2(n) transmits a third scan signal, a fourth scan signal line Scan1(n) transmits the fourth scan signal, a light emission control signal line EM(n) transmits a light emission control signal, and a power supply low-potential signal line VSS transmits a low electrical potential.

It should be noted that Scan1 and Scan2 represent two sets of scan lines, and Scan(n−1) and Scan(n) represent two levels of scan lines.

It should be noted that, an arrangement and a connection relationship of each element the pixel driving circuits in two sub-pixels are shown in FIG. 2, and for a convenience of viewing a design of the compensation transistor and the first initialization transistor, some elements and wires are not shown. For example, the first initialization signal line VI-1 is not shown in FIG. 2.

Specifically, as shown in FIG. 3, Drive TFT, T2, T3, T4, T5, T6, and T7 respectively represents setting positions of the active patterns of each of the transistors, and the first active pattern and the second active pattern can each be seen to include a bent structure. As shown in FIG. 4, the gates of the transistors are represented by Drive TFT, T2, T3, T4, T5, T6, and T7 respectively represents the gates of each of the transistors. As can be seen from FIG. 4, the first gate and the second gate of the compensation transistor T3 are two portions that are perpendicular to each other, and the third gate and the fourth gate of the first initialization transistor T4 are two portions that are perpendicular to each other. As shown in FIG. 5 and FIG. 6, structures and arranging positions of wires are shown. Furthermore, as can be seen from FIG. 5 and FIG. 6, components located in different film layers can be connected by through holes and by metal of the corresponding film layer in FIG. 2. Therefore, there are unlabeled parts in FIG. 5 and FIG. 6, the unlabeled parts indicate that there are through-hole-connections, and wires can serve as connection wires.

It should be noted that, in the above-mentioned embodiments, the arrangement of the compensation transistor and the first initialization transistor is described in detail with the pixel driving circuit shown in FIG. 1 and the perspective view in FIG. 2, but embodiments of the present application is not limited thereto. For example, the pixel driving circuit can adopt other manners of design, e.g., other double-gate transistors with a different design connected to the drive transistor, and channels of other double-gate transistors with a different design can also be designed to reduce the flickering display.

It should be noted that the display panel shown in FIG. 8, FIG. 9, and FIG. 10 and the display panel shown in FIG. 2 only have structural differences between the compensation transistor and the first initialization transistor. The exploded views of the display panel can be determined in accordance with the exploded view of the display panel in FIG. 2, and details will not be reiterated herein.

In addition, an embodiment of the present application provides a display device, and the display device includes the display panel and electronic components described in any one of the above-mentioned embodiments.

According to the above embodiment, it can be noted that:

The present application provides the display panel and the display device. The display panel includes the plurality of light-emitting elements arranged in an array and the pixel driving circuit for driving the light-plurality of emitting elements. The pixel driving circuit includes the first initialization transistor, the switch transistor, a drive transistor, and a compensation transistor. The first initialization transistor is connected to the first initialization signal line and configured for inputting the first initialization signal to the first node under the control of the first scan signal. The switch transistor is configured for inputting the data signal to the second node under the control of the second scan signal. The drive transistor is configured for driving the plurality of light-emitting elements to emit light under the control of the electrical potential of the first node and the electrical potential of the second node. The compensation transistor is connected to the drive transistor through the first node and the third node and configured for compensating the threshold voltage of the drive transistor under the control of the third scan signal. The compensation transistor includes the first gate and the second gate that are connected and the first active pattern. The first initialization transistor includes the third gate and the fourth gate that are connected and the second active pattern. The width-to-length ratio of the first channel of the compensation transistor is less than the width-to-length ratio of the second channel of the first initialization transistor. The first channel includes the first sub-channel and the second sub-channel. The second channel includes the third sub-channel and the fourth sub-channel. The first sub-channel is located on the side of the second sub-channel adjacent to the drive transistor. The third sub-channel is located on the side of the fourth sub-channel adjacent to the drive transistor. The width-to-length ratio of the first sub-channel is less than the width-to-length ratio of the third sub-channel. In the present application, through having the width-length ratio of the first channel of the compensation transistor less than the width-to-length ratio of the first initialization transistor, and having the width-to-length ratio of the first sub-channel less than the width-length ratio of the third sub-channel, the effect of the electrical leakage of the compensation transistor on the gate of the drive transistor can be decreased or the effect of the electrical leakage of the first initialization transistor on the gate of the drive transistor can be increased, so that the effect of the increase in the electrical potential of the gate of the drive transistor affected by the electrical leakage of the compensation transistor is canceled by the effect of the decrease in the electrical potential of the gate of the drive transistor affected by the electrical leakage of the first initialization transistor, thereby preventing the electrical leakage of each of the transistors from causing changes in the electrical potential of the gate of the drive transistor and reducing the problem of the flickering display.

In the above embodiments, the descriptions of the various embodiments are different in emphases, for contents not described in detail, please refer to related description of other embodiments.

The display panel and the display device provided by embodiments of the present application are described in detail above, and the description of embodiments above is only for helping to understand technical solutions of the present application and its core idea. It should be understood that for a person of ordinary skill in the art can make various modifications of the technical solutions of the embodiments of the present application above. However, it does not depart from the scope of the technical solutions of the embodiments of the present application.

What is claimed is:

1. A display panel, wherein the display panel comprises a plurality of light-emitting elements arranged in an array and a pixel driving circuit driving the plurality of light-emitting elements, and the pixel driving circuit comprises:
   a first initialization transistor connected to a first initialization signal line and configured for inputting a first initialization signal to a first node under a control of a first scan signal;
   a switch transistor for inputting a data signal to a second node under a control of a second scan signal;
   a drive transistor electrically connected to the first node and the second node and configured for driving the plurality of light-emitting elements to emit light under a control of an electrical potential of the first node and an electrical potential of the second node; and
   a compensation transistor connected to the drive transistor through the first node and a third node and configured for compensating a threshold voltage of the drive transistor under a control of a third scan signal;
   wherein the compensation transistor comprises a first channel comprising at least two sub-channels, the first initialization transistor comprises a second channel comprising at least two other sub-channels, and
   a width-to-length ratio of a sub-channel of the compensation transistor adjacent to the drive transistor is less than a width-to-length ratio of the second channel of the first initialization transistor, wherein the width-to-length ratio of the second channel is equal to a sum of width-to-length ratios of the at least two sub-channels of the second channel.

2. The display panel according to claim 1, wherein the width-to-length ratio of the sub-channel of the compensation transistor adjacent to the drive transistor is less than a width-to-length ratio of a sub-channel of the first initialization transistor adjacent to the drive transistor.

3. The display panel according to claim 2, wherein the at least two sub-channels of the first channel comprise at least a first sub-channel and a second sub-channel, the at least two other sub-channels of the second channel comprise at least a third sub-channel and a fourth sub-channel, the first sub-channel is the sub-channel of the compensation transistor adjacent to the drive transistor, the third sub-channel is the sub-channel in the first initialization transistor adjacent to the drive transistor, the width-to-length ratio of the first sub-channel is less than the width-to-length ratio of the third sub-channel, and a width-to-length ratio of the first channel is less than a width-to-length ratio of the second channel of the first initialization transistor.

4. The display panel according to claim 3, wherein the width-to-length ratio of the first sub-channel is less than a width-to-length ratio of the second sub-channel, and the width-to-length ratio of the third sub-channel is greater than a width-to-length ratio of the fourth sub-channel.

5. The display panel according to claim 4, wherein the width-to-length ratio of the second sub-channel is equal to the width-to-length ratio of the fourth sub-channel, or the width-to-length ratio of the second sub-channel is less than the width-to-length ratio of the fourth sub-channel.

6. The display panel according to claim 3, wherein the width-to-length ratio of the first sub-channel is less than a width-to-length ratio of the second sub-channel, the width-to-length ratio of the third sub-channel is equal to a width-to-length ratio of the fourth sub-channel, and the width-to-length ratio of the second sub-channel is equal to the width-to-length ratio of the fourth sub-channel.

7. The display panel according to claim 3, wherein a width-to-length ratio of the second sub-channel is greater than a width-to-length ratio of the fourth sub-channel, the width-to-length ratio of the first sub-channel is equal to the width-to-length ratio of the second sub-channel, and the width-to-length ratio of the first sub-channel is equal to the width-to-length ratio of the fourth sub-channel.

8. The display panel according to claim 3, wherein the width-to-length ratio of the first sub-channel is equal to a width-to-length ratio of the second sub-channel, and the width-to-length ratio of the third sub-channel is equal to a width-to-length ratio of the fourth sub-channel.

9. The display panel according to claim 8, wherein the compensation transistor comprises a first gate and a second gate that are connected and a first active pattern, the first initialization transistor comprises a third gate and a fourth gate that are connected and a second active pattern, a first overlapping region of the first active pattern and the first gate is in the first sub-channel, a second overlapping region of the first active pattern and the second gate is in the second sub-channel, a third overlapping region of the second active pattern and the third gate is in the third sub-channel, and a fourth overlapping region of the second active pattern and the fourth gate is in the fourth sub-channel;
   a ratio of a width of the first active pattern to a width of the first gate located in the first overlapping region is equal to a ratio of a width of the first active pattern to a width of the second gate located in the second overlapping region, a ratio of a width of the second active pattern to a width of the third gate located in the third overlapping region is equal to a ratio of a width of the second active pattern to a width of the fourth gate located in the fourth overlapping region, and a ratio of the width of the first active pattern to the width of the first gate located in the first overlapping region is less than a ratio of the width of the second active pattern to the width of the third gate located in the third overlapping region.

10. The display panel according to claim 9, wherein the width of the first gate located in the first overlapping region is equal to the width of the second gate located in the second overlapping region, the width of the third gate located in the third overlapping region is equal to the width of the fourth gate located in the fourth overlapping region, and the width of the first gate located in the first overlapping region is greater than the width of the third gate located in the third overlapping region.

11. The display panel according to claim 10, wherein the width of the first active pattern located in the first overlapping region is equal to the width of the first active pattern located in the second overlapping region, the width of the second active pattern located in the third overlapping region is equal to the width of the second active pattern located in the fourth overlapping region, and the width of the first active pattern located in the first overlapping region is equal to the width of the second active pattern located in the third overlapping region.

12. The display panel according to claim 9, wherein the width of the first active pattern located in the first overlapping region is equal to the width of the first active pattern located in the second overlapping region, the width of the second active pattern located in the third overlapping region is equal to the width of the second active pattern located in the fourth overlapping region, and the width of the first active pattern located in the first overlapping region is equal to the width of the second active pattern located in the third overlapping region.

13. The display panel according to claim 12, wherein the width of the first gate located in the first overlapping region is equal to the width of the second gate located in the second overlapping region, the width of the third gate located in the third overlapping region is equal to the width of the fourth gate located in the fourth overlapping region, and the width of the first gate located in the first overlapping region is equal to or greater than the width of the third gate located in the third overlapping region.

14. The display panel according to claim 1, wherein the first initialization transistor is a low temperature polysilicon thin-film transistor, the compensation transistor is a low temperature polysilicon thin film transistor, the compensation transistor comprises a first gate and a second gate, the first initialization transistor comprises a third gate and a fourth gate, a gap is between a projection of the first gate and a projection of the second gate on the first active pattern, and a gap is between a projection of the third gate and a projection of the fourth gate on the second active pattern.

15. The display panel according to claim 1, wherein adjacent pixel driving circuits horizontally arranged are symmetrically arranged, the first initialization transistor in each of the adjacent pixel driving circuits are is connected to a same initialization signal line, and the compensation transistor in each of the adjacent pixel driving circuits are is connected to a same scan line.

16. The display panel according to claim 1, wherein the pixel driving circuit further comprises a second initialization transistor, wherein the second initialization transistor is connected to a second initialization signal line and configured for inputting a second initialization signal to an anode of each of the plurality of light-emitting elements under a control of a fourth scan signal;
   a first light emission control transistor connected to the drive transistor through the second node and configured for conducting a current flowing from a power supply high-potential signal line to the drive transistor under a control of a light emission control signal; and
   a second light emission control transistor connected to the drive transistor through the third node and configured for conducting a current flowing from the drive transistor to the anode of the light-emitting device under a control of the light emission control signal.

17. The display panel according to claim 16, wherein the pixel driving circuit further comprises a storage capacitor, an end of the storage capacitor is connected to the power supply high-potential signal line, and another end of the storage capacitor is connected to the first node.

18. The display panel according to claim 1, wherein the display panel comprises:
   a substrate; and
   a pixel driving circuit layer comprising a plurality of pixel driving circuits;
   wherein each of the plurality of pixel driving circuits comprises a semiconductor layer, a first metal layer, a second metal layer, and a third metal layer that are sequentially arranged in stack on the substrate, the semiconductor layer comprises the a first active pattern and the a second active pattern, and the first metal layer comprises a first gate, a second gate, a third gate, and a fourth gate.

19. The display panel according to claim 18, wherein the second metal layer is formed with an electrode plate of a storage capacitor.

20. The display panel according to claim 18, wherein the third metal layer is formed with a source and a drain.

* * * * *